United States Patent [19]

Bruel et al.

[11] Patent Number: 4,527,044
[45] Date of Patent: Jul. 2, 1985

[54] APPARATUS FOR TREATING A SAMPLE BY A PULSED ELECTRON BEAM

[75] Inventors: Michel Bruel, Veurey, France; Michel Floccari, deceased, late of Grenoble, France, by Henriette Floccari, administratrix; Jean-Francois Michaud, Montmelian, France

[73] Assignee: Commissariat a l'Energie Atomique, Paris, France

[21] Appl. No.: 370,386

[22] Filed: Apr. 21, 1982

[30] Foreign Application Priority Data

Apr. 28, 1981 [FR] France .................... 81 08449

[51] Int. Cl.³ .................... B23K 15/00; B23K 9/00
[52] U.S. Cl. .................... 219/121 EB; 219/121 PR; 219/121 P; 219/121 PW; 219/121 EA; 219/121 ET; 315/111.81; 315/111.91; 315/241 R; 250/492.3
[58] Field of Search ............ 219/121 EB, 121 EM, 219/121 EJ, 121 ET, 121 EA, 121 PR, 121 P, 121 PW; 315/111.21, 111.31, 111.81, 241 R, 111.91; 148/1.5; 250/492.1, 492.3

[56] References Cited
U.S. PATENT DOCUMENTS

| | | | |
|---|---|---|---|
| 3,950,187 | 4/1976 | Kirkpatrick | 219/121 EM |
| 3,955,091 | 5/1976 | Robinson et al. | 315/111.31 |
| 4,082,958 | 4/1978 | Kirkpatrick | |
| 4,301,391 | 11/1981 | Seliger et al. | 315/111.31 |
| 4,335,297 | 6/1982 | Little | 315/111.21 |
| 4,344,019 | 8/1982 | Gavin et al. | 315/111.81 |

OTHER PUBLICATIONS

Journal of Applied Physics, vol. 50, No. 2, Feb. 1979, Greenwald et al.
Solid State Technology, vol. 22, No. 4, Apr. 1979, Greenwald et al.

Primary Examiner—M. H. Paschall
Attorney, Agent, or Firm—Dennis P. Clarke

[57] ABSTRACT

The invention relates to an apparatus for treating samples comprising in a vacuum enclosure a cathode, an actual anode and a grid, as well as means for supplying the sample to the enclosure, a high voltage generator, a capacitor $C_1$ charged by way of the said generator, a spark gap switch for producing a high energy pulse between the cathode and the grid, said switch being connected to one terminal of said capacitor, an element for producing pulses controlling the spark gap switch and a capacitor $C_2$ having a capacitance above that of capacitor $C_1$, charged by way of the generator used for producing between the actual anode and the cathode an electric field for accelerating and extracting electrons used for the bombardment of the sample.

1 Claim, 2 Drawing Figures

APPARATUS FOR TREATING A SAMPLE BY A PULSED ELECTRON BEAM

BACKGROUND OF THE INVENTION

The present invention relates to an apparatus for treating a sample by a pulsed electron beam and is used more particularly in the treatment of the surface layers of semiconductor materials.

Thus, on implanting foreign particles or impurities e.g. in a semiconductor substrate by carrying out a bombardment of the latter, it is known that following the said implantation it is necessary to perform a stage called annealing enabling the implanted impurities to be made electrically active and enabling the rearrangement of the crystal lattice of the substrate, which was subject to interference during the bombardment.

One of the most frequently used methods for carrying out this annealing stage is to raise the implanted substrate to a high temperature (approximately 900° to 1200° C.) for a certain time.

Another more recent method consists of briefly applying a high energy density to the surface or at the level of the first implanted layers in such a way that very high temperatures are locally reached during this time. In certain cases the temperatures reached make it possible to liquefy the first layers of the substrate, thereby curing the damage produced during implantation. Due to the fact that the temperature rise is very localized and of short duration (below 1 millisecond) the remainder of the substrate is not affected.

The energy can be supplied to the surface or the first layers of the substrate either by means of a light energy burst using e.g. a laser or a flash tube, or by means of an intense beam of particles such as electrons. These particle or light beams can be pulsed or unpulsed narrow or wide beams and can sweep over the substrate in such a way as to "anneal" the latter at different points.

Known apparatus for treating samples by means of intense, pulsed electron beams generally comprise a field-plasma emission diode of the type shown in FIG. 1.

This apparatus comprises a diode constituted by a generally graphite cathode 2, provided with a plurality of grooves, and an anode 4 constituted by an actual anode 4a and an grid 4b, the two elements 4a and 4b being raised to the same potential. This diode is generally placed in a vacuum enclosure 6.

Moreover, such apparatus generally comprise a high voltage generator 8 connected to the high voltage energy storage system 10 which can be formed, for example, by a coaxial line or a capacitor, as well as a pulse triggering switch 14, such as a spark gap switch. Such apparatus also comprise a supply system 16 supplying the samples 18 to be treated to the vacuum enclosure 6, and systems 20 enabling the measurement of the voltage and current supplied by the generator 8 over a period of time. The actual anode 4 a serves as a support for the sample 18.

Such apparatus have been described, for example, in the Kirkpatrick U.S. Pat. No. 3,950,187 entitled "Method and apparatus involving pulsed-electron-beam processing of semiconductor devices", as well as in an article in the Journal of Applied Physics, vol. 50, no. 2, February 1979 entitled "Pulsed-electron-beam annealing of ion implantation damage".

In such apparatus, the application of a high voltage between the anode grid 4b and cathode 2 by means, for example, of a capacitor 10, previously charged by the generator 8, makes it possible to produce an intense electric field in the vicinity of the diode cathode 2. The application of the charging voltage of capacitor 10 is ensured by means of the spark gap switch 14 controlled by the pulse triggering system 12.

The electric field produced is intensified in the vicinity of the cathode by the presence of whiskers, resulting from the not shown grooves on the cathode. These whiskers lead to the emission of an electric field. The electric power supplied in this way is such that there is an explosion of these whiskers corresponding to an explosive vapourization and an ionization thereof. The plasma microspheres produced in this way in turn become an electron source favouring the rapid rise in the current, which itself aids the explosion. In a few nanoseconds, each of the plasma microspheres extends sufficiently for the cathode to be covered with a continuous plasma envelope or shell. The thickness of the latter increases due to expansion until it reaches the anode grid, producing a diode short-circuit, known as a diode-closure.

The capacitor 10, charged by generator 8, continues to discharge into the diode. The voltage applied between the anode and the cathode by the capacitor has made it possible, prior to the short-circuit taking place, to extract and accelerate the electrons produced so as to perform an intense, pulsed electron beam which can be used e.g. for the annealing of sample 18.

The fact that such an apparatus uses the actual anode 4a serving as a support for sample 18 leads to the positive polarization of the sample and enables the electrons to easily penetrate the latter, whereas the ions formed cannot penetrate the sample and are automatically repelled. Thus, an intense, pulsed electron beam is indeed obtained.

Therefore, via capacitor 10, the high voltage generator 8 is used both for producing the plasma shell acting as the electron source, as well as for extracting and accelerating the latter.

Such apparatus make it possible to produce electron beams, whose energy is between 10 and 50 kiloelectron volts (KeV), whose intensity is between 100 and a few thousand A/cm$^2$ and whose pulse length is between a few dozen nanoseconds and a few microseconds.

Further details on the operating principle of such apparatus can be obtained from the article in the Journal of Applied Physics, vol. 45, no. 6, June 1974 entitled "Plasma-induced field emission and the characteristics of high-current relativistic electron flow".

However, these simple apparatus have a certain number of disadvantages, which are in particular:
the need of suddenly producing a high voltage in the space between the anode and the cathode under conditions such that the intensity must be very high, i.e. between 100 and 10,000 amperes;
the characteristics of the electron beam, i.e. its energy and current density, cannot be selected independently of the conditions under which the plasma is produced, thus e.g. if it is desired to obtain a low energy electron beam, i.e. of approximately 20 KeV, it does not stand to reason that the corresponding electric field will be sufficient for producing the plasma shell;
the use of a very high power system for producing the plasma, although this is not required for producing the latter.

BRIEF SUMMARY OF THE INVENTION

The object of the present invention is an apparatus for treating a sample by a pulsed electron beam, which makes it possible to obviate the aforementioned disadvantages.

The apparatus according to the invention, using the same principles as described hereinbefore, makes it possible to separate the two functions of producing the plasma shell and extracting and accelerating the electrons produced.

More specifically the invention relates to an apparatus for treating a sample by an electron beam of the type described hereinbefore, but in which the vacuum tube has three independent electrodes. This apparatus also comprises:

(A) a first circuit for producing a plasma in pulsed manner from the cathode of the vacuum tube, said first circuit comprising:
  (a) a capacitor of capacitance $C_1$ charged by means of a high d.c. voltage generator, said capacitor being provided with first and second coatings,
  (b) a spark gap switch making it possible to initiate the discharge of the capacitor of capacitance $C_1$, so as to produce a high voltage pulse between the cathode and the grid, said switch being arranged in series with said capacitor, and
  (c) means for producing pulses controlling the spark gap switch; and
(B) a second circuit for producing between the actual anode and the cathode an electric field making it possible to accelerate and extract the electrons produced in such a way that they bombard the sample, said circuit comprising a capacitor of capacitance $C_2$ well above capacitance $C_1$, said capacitor of capacitance $C_2$ being charged by means of a high d.c. voltage generator and able to discharge by the actual vacuum tube.

According to a preferred embodiment of the invention the first circuit also comprises two identical resistors $R_1$ and $R_2$ connected in series with the capacitor of capacitance $C_1$ in such a way that one of the terminals of resistor $R_1$ is connected to the first coating of the capacitor and that one of the terminals of resistor $R_2$ is connected to the second coating of the capacitor, the spark gap switch then being connected on the one hand to the first coating of the capacitor of capacitance $C_1$ and on the other to the other terminal of resistor $R_2$ and it also comprises the capacitor of capacitance $C_2$ connected in parallel to the circuit $R_1 C_1 R_2$.

In this embodiment and as a result of the high value of the resistors $R_1$ and $R_2$ compared with the impedance of the remainder of the first circuit, the voltage applied between the cathode and the grid at the time of switching off the spark gap switch is the sum of the voltages stored in the capacitors of capacitance $C_1$ and $C_2$, namely twice the voltage of the d.c. voltage generator.

BRIEF DESCRIPTION OF THE DRAWINGS

The invention is described in greater detail hereinafter relative to non-limitative embodiments and the attached drawings, wherein show.

DETAILED DESCRIPTION OF THE PREFERRED EMBODIMENTS

Figure 1:
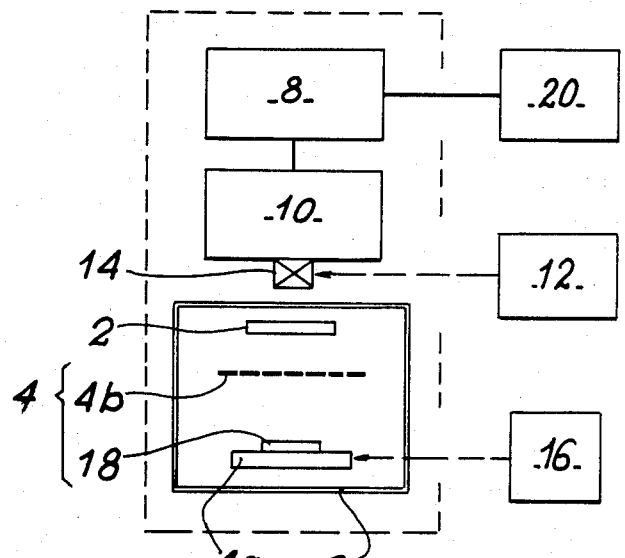
FIG. 1 already described, diagrammatically a prior art apparatus for treating samples.
Figure 2:
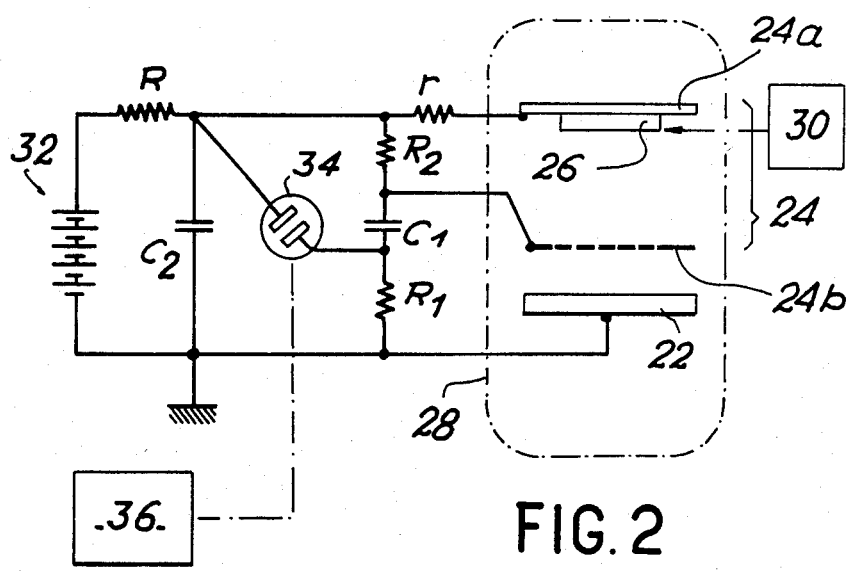
FIG. 2 diagrammatically, an apparatus for treating samples according to the invention.

The apparatus according to the invention, diagrammatically shown in FIG. 2, comprises inter alia a discharge tube incorporating a cathode 22 provided with a plurality of not shown grooves and an anode 24 constituted by the actual anode 24a and a grid 24b. This tube makes it possible to produce a beam of intense, pulsed electrons able to bombard a sample 26 placed on the actual anode 24a, which is used as a support. The use of the actual anode 24a as a sample support enables the positive polarization of the sample, which leads to the electrons penetrating the sample and to the removal of the ions which are also formed. The electrodes and the sample are placed in a vacuum enclosure 28. Means 30 are provided for supplying the sample to be treated to the interior of enclosure 28.

The apparatus also comprises a high d.c. voltage generator 32 for charging a capacitor of capacitance $C_1$ and a capacitor of capacitance $C_2$, connected in parallel, with a voltage V. The capacitances $C_1$ and $C_2$ are such that capacitance $C_2$ is well above capacitance $C_1$ i.e. capacitance $C_2$ is 10 to 50 times higher than capacitance $C_1$.

In addition, the capacitor of capacitance $C_1$ is connected in series with two identical resistors $R_1$ and $R_2$ located on either side of the said capacitor. Thus, one of the terminals of resistor $R_1$ is connected to earth and the other terminal is connected to one of the coatings of the capacitor of capacitance $C_1$, whereas one of the terminals of resistor $R_2$ is connected to the positive terminal of the high voltage generator 32, whilst the other terminal is connected to the other coating of the capacitor.

In addition, the assembly constituted by the two resistors $R_1$, $R_2$ and the capacitor of capacitance $C_1$ can be connected in series with a resistor r and the capacitor of capacitance $C_2$ can be connected in series with a resistor R. Resistor R is well above resistor r, as will be shown hereinafter.

The apparatus also comprises a spark gap switch 34 controlled by a pulse generator 36. Switch 34 is connected on the one hand to the positive terminal of the high voltage generator 32 via resistor R and on the other hand to the coating of the capacitor of capacitance $C_1$ connected to resistor $R_1$.

In the apparatus according to the invention, the diode cathode 22 is connected to earth, anode grid 24b is connected to the terminal of resistor $R_2$ connected to one of the coatings of the capacitor of capacitance $C_1$ and the actual anode 24a is connected to the other terminal of resistor $R_2$ via resistor r.

The circuit essentially comprising the capacitor of capacitance $C_1$, the capacitor of capacitance $C_2$ and the spark gap switch 34 controlled by pulse generator 36, constitutes a low power circuit ($C_1$ being below $C_2$) making it possible to produce a plasma by producing a vaporization and an ionization in the vicinity of cathode 22. The plasma is produced by applying to the terminals of the grid-cathode space the sum of the voltages stored in the capacitors of capacitances $C_1$ and $C_2$ under the control of spark gap switch 34.

The circuit which essentially comprises the capacitor of capacitance $C_2$ constitutes a high power circuit permitting the extraction and acceleration of the electrons produced by creating a high electric field between the actual anode 24a and the cathode 22. Unlike in the prior art apparatus this circuit has no switch of spark gap switch, thereby obviating the problems caused by the sudden closing of the high power circuit.

The apparatus according to the invention has a further advantage linked with the independence of the two functions, i.e. on the one hand the creation of the plasma and on the other the extraction and acceleration of the electrons. This makes it possible to choose the extraction and acceleration voltage without it having any effect on the creation of the plasma, the necessary power being a function of the voltage supplied by the high voltage generator 32 and the value of the capacitance $C_2$ of the corresponding capacitor.

As has been stated hereinbefore, the apparatus according to the invention functions in the same way as the prior art apparatus, except for the fact that the high power circuit has no switch. Moreover, the use of two identical resistors $R_1$ and $R_2$ with a very high impedance compared with the values of the spark gap switch 34 and capacitances $C_1$ and $C_2$ makes it possible to obtain, when the pulse generator 36 switches off spark gap switch 34 bringing about the discharge of the capacitor of capacitance $C_1$, a pulse between anode grid 24b and diode cathode 22, whose voltage is double that supplied by the high voltage generator 32. This is linked with the arrangement of the different components forming the low power circuit.

An embodiment, as well as examples of processing samples, will now be described.

The high voltage generator makes it possible to charge the capacitors of capacitances $C_1$ and $C_2$ of respectively 1 and 40 nanofarads under a voltage of 30 kilovolts. The resistors R and r are respectively resistances of 30 megohms (M$\Omega$) and 2$\Omega$, whilst resistors $R_1$ and $R_2$ have resistances of 300 M$\Omega$.

Sample treatment tests have been performed on silicon plates or wafers having a surface area of approximate diameter 2.5 cm using a diode, whose circular cathode has a diameter of 2.5 cm, with a cathode-grid spacing of 4 to 6 mm and a grid-actual anode spacing of 0 to 3.5 cm.

The energy supplied for annealing these plates can be controlled by means of the acceleration voltage, which is itself controlled, and by means of the distance between the actual anode and the grid. This distance also makes it possible to control the pulse length. Moreover, the energy supplied is dependent on the nature of the cathode. Thus, the nature of the cathode makes it possible to control the nature of the plasma and as a result the expansion rate, the pulse length and the energy supplied.

Tests have been performed with graphite, aluminium, antimoney and silicon cathodes corresponding respectively to expansion rates of 3, 2, 1 and 2 cm/$\mu$s.

The sample treatment examples described hereinbefore relate to an annealing of samples which have previously undergone an ion implantation but obviously any other type of treatment can be envisaged.

In addition, without passing beyond the scope of the invention, it is possible to propose different diagrams from those described hereinbefore. For example, the low power triggering circuit for creating the plasma between the cathode and the grid and the high power circuit for accelerating the electrons towards the anode can be independent and have separate high power generators and/or separate switches.

What is claimed is:

1. An apparatus for the treatment of a sample by a pulsed electron comprising, in a vacuum enclosure, a cathode and an anode constituted by the actual anode and a grid, means for supplying the sample to be treated to the said vacuum enclosure, a high d.c. voltage generator, and
   (A) a first circuit for producing a plasma in pulsed manner from the cathode, said first circuit comprising
      (a) a capacitor of capacitance $C_1$ charged by means of the high d.c. voltage generator, said capacitor being provided with first and second coatings,
      (b) a spark gap switch enabling the initiation of the discharge of the capacitor of capacitance $C_1$ so as to produce a high voltage pulse between the cathode and the grid, said spark gap switch being arranged in series with the said capacitor,
      (c) means for producing pulses controlling the spark gap switch,
      (d) two resistors $R_1$ and $R_2$ connected in series with the capacitor of capacitance $C_1$ in such a way that one of the terminals of resistor $R_1$ is connected to the first coating of the said capacitor and wherein one of the terminals of resistor $R_2$ is connected to the second coating of said capacitor, the spark gap switch then being connected on the one hand to the first coating of the capacitor of capacitance $C_1$ and on the other hand to the other terminal of resistor $R_1$, and wherein it also comprises the capacitor or capacitance $C_2$ connected in parallel with the circuit $R_1$ $C_1$ $R_2$; and
   (B) a second circuit separate from said first circuit for producing an electric field between the actual anode and the cathode enabling the acceleration and extraction of the electrons produced in such a way that they bombard the sample, said second circuit comprising a capacitor of capacitance $C_2$, which is much higher than capacitance $C_1$, capacitor $C_2$ being charged by a d.c. voltage generator and which can be discharged by the vacuum enclosure, so as to produce the electric field between the anode and the cathode.

* * * * *